(12) United States Patent
Lai et al.

(10) Patent No.: US 7,508,236 B2
(45) Date of Patent: Mar. 24, 2009

(54) LINE DRIVER DEVICE

(75) Inventors: Fermion Lai, Taichung (TW); Hao-Chang Chang, Jhubei (TW)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/507,359

(22) Filed: Aug. 18, 2006

(65) Prior Publication Data

US 2008/0042688 A1    Feb. 21, 2008

(51) Int. Cl.
*H03K 19/094* (2006.01)
*H03K 19/0175* (2006.01)

(52) U.S. Cl. .............................. 326/86; 326/30; 326/87

(58) Field of Classification Search ................... 326/86, 326/90, 115, 126–127, 30, 87
See application file for complete search history.

(56) References Cited

U.S. PATENT DOCUMENTS 6,185,263 B1 * 2/2001 Chan ......................... 375/295
6,762,625 B1 * 7/2004 Devnath ..................... 326/115

* cited by examiner

*Primary Examiner*—Anh Q Tran
(74) *Attorney, Agent, or Firm*—Maginot, Moore & Beck

(57) ABSTRACT

A line driver device is provided in which an output stage can be controlled so as to provide an output current according to at least a first or a second operating mode of the line driver device, the first operating mode corresponding to a class A mode of the line driver device and the second operating mode corresponding to a class B mode of the line driver device.

24 Claims, 6 Drawing Sheets

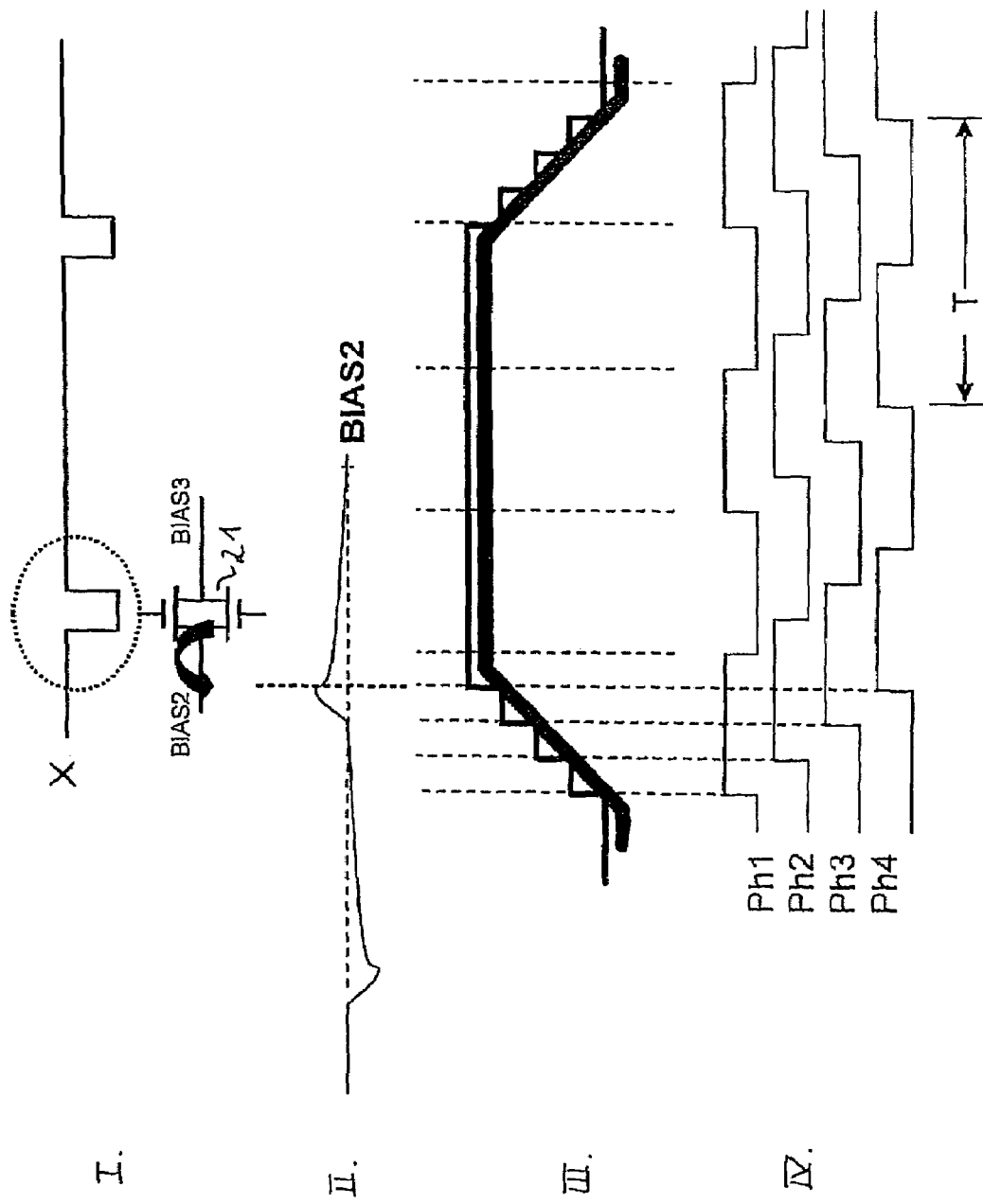

US 7,508,236 B2

LINE DRIVER DEVICE

BACKGROUND OF THE INVENTION

The present application relates to a line driver device, a line driver cell to be used within the line driver device, and a method of operating a line driver device.

To give only one of many examples, in Ethernet interfaces, in particular of the FastEthernet type, it is known to use class A current mode line drivers for supplying a digital data signal onto a communication line, e.g. a network cable. A class A current mode line driver will consume 40 mA per port. This leads to problems concerning the generation of heat, especially in multi-port applications and when the interface is housed in a plastic cassette or housing. As an alternative, a class B current mode line driver may be used. On average, a class B line driver will consume only 20 mA per port. However, the performance of the class B current mode line driver depends strongly on the package, components on the printed circuit board of a line driver device, and the layout quality of the printed circuit board. When using a class B current mode line driver, it may therefore be difficult, if not impossible, to comply with the standard specifications for the interface.

A solution to the problem of high power consumption and overheating in class A current mode line drivers is, for example, to add heat sinks or other suitable cooling devices. In class B current mode line drivers, specification compliance has to be ensured by imposing strict package and printed circuit board layout requirements. In both cases, significant additional outlay is required to achieve acceptable results.

SUMMARY

Embodiments of the present invention address the shortcomings of the prior art.

A first embodiment of the invention is a line driver device that includes an output stage, which is operable to provide an output current according to at least a first or a second operating mode of the line driver device. The first operating mode corresponds to a class A mode and the second operating mode corresponds to a class B mode.

BRIEF DESCRIPTION OF THE SEVERAL VIEWS OF THE DRAWING(S)

FIG. 7 illustrates a method of canceling signal overshoot in the line driver cell according to FIGS. 5 and 6.

DETAILED DESCRIPTION OF THE INVENTION

Figure 1:
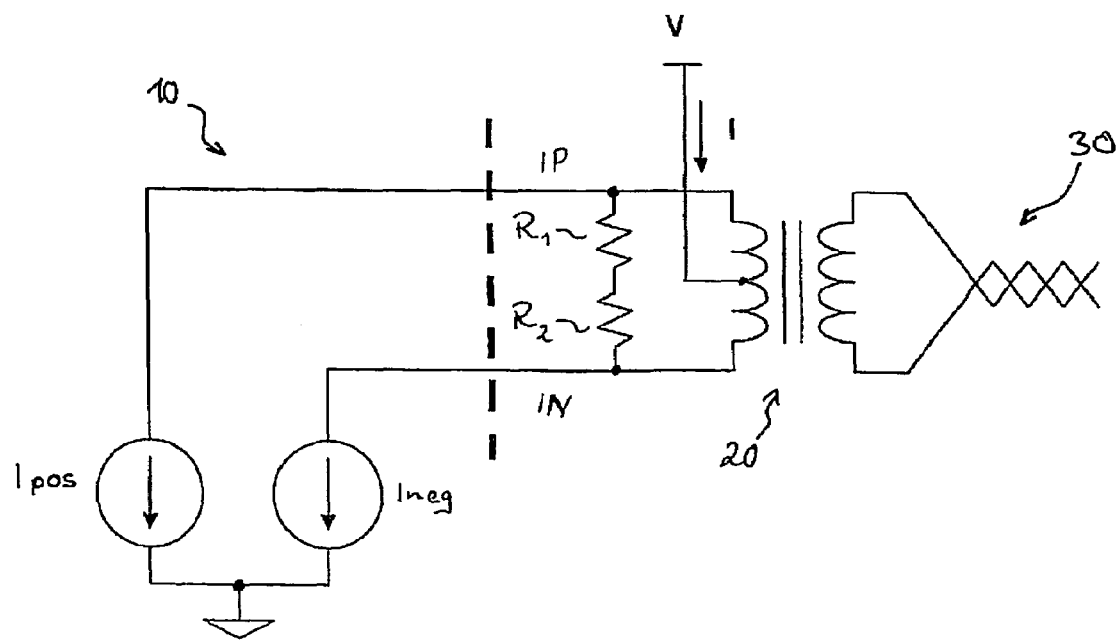
FIG. 1 is a schematic view of a line interface using a line driver device having a differential current output.

The following detailed description explains exemplary embodiments of the present invention. The description is not to be taken in a limiting sense, but is made only for the purpose of illustrating the general principles of the invention. The scope of the invention, however, is only defined by the claims and is not intended to be limited by the exemplary embodiments described below.

It is to be understood that in the following detailed description of exemplary embodiments any shown or described direct connection or coupling between two circuit points, functional blocks, devices or other physical or functional units can be implemented in some embodiments also by indirect connection or coupling. For example, one or more filters, interfaces or drivers can be provided depending on requirements of specific embodiments.

While embodiments of the invention will be described in the context of a line driver for telecommunication such as Ethernet, those skilled in the art will understand that other embodiments of the present invention may be implemented for other telecommunication systems such as xDSL, ISDN or other applications such as drivers for audio systems.

In general, at least some embodiments of the present invention have multiple operating modes of a line driver device. One operating mode corresponds to a class A mode and another operating mode corresponds to a class B mode. In one embodiment, also mixed operating modes are provided, which have characteristics of both the class A mode and the class B mode.

In the context of the present application, the class A mode corresponds to an operating mode in which the line driver device has a supply current which is substantially independent of the output signal of the line driver device. The class B mode corresponds to an operating mode in which the line driver device has a supply current which is substantially zero if there is no output signal from the line driver device.

In case of generating the output signal according to the MLT-3 standard, in which the output signal sequentially has one of three states, typically designated as "+1", "0" and "−1", the power or current consumption of the line driver device in the class B mode or mixed mode is significantly reduced as compared to the pure class A mode. This significantly reduces the heat generated in the line driver device.

According to an embodiment of the invention, a line driver device is provided which comprises an output stage that can be controlled so as to provide an output current according to at least a first or a second operating mode of the line driver device, the first operating mode corresponding to the class A mode and the second operating mode corresponding to the class B mode.

In one embodiment, the line driver device has a first branch with a first portion of the output stage and a second branch with a second portion of the output stage. The first and second portion of the output stage may be designed to have different maximum output currents. For example, if the ratio of the maximum output current of the first portion of the output stage and the maximum output current of the second portion of the output stage is 1:3, this allows for providing mixed operating modes of the line driver device corresponding to ¾ class A and ¼ class B, or ¼ class A and ¾ class B, by suitably selecting the operating mode of the first branch and the second branch.

In one embodiment, the output stage of the line driver device is based on a single type of line driver cells, which are configured to provide a positive unit output current, a negative unit output current or a zero output current, depending on the desired output signal of the line driver device. According to an embodiment, an encoded input signal is used to control the line driver cells.

In addition, the line driver device may also comprise a pre-driver stage which supplies an encoded input signal to the output stage. The pre-driver stage has at least one pre-driver of a first type and at least one pre-driver of a second type, corresponding to the first operating mode and the second operating mode of the line driver device, respectively. That is to say, the line driver device may comprise different pre-drivers for the class A mode and for the class B mode, which can be selectively activated.

As already mentioned, the output stage may be controlled by means of an encoded input signal. Therefore, the line driver device may also comprise encoding means for generating the encoded input signals of the output stage on the basis of an input signal of the line driver device.

According to an embodiment, a first encoder receives the input signal of the line driver device and generates a first control signal for controlling a line driver cell of the output stage to operate according to the first operating mode. A second encoder is provided, which receives the input signal of the line driver device and generates a second control signal for controlling a line driver cell of the output stage to operate according to the second operating mode. A multiplexer may be provided for selectively forwarding either the first control signal from the first encoder or the second control signal from the second encoder to the output stage.

According to an embodiment, the pre-driver stage and the output stage are connected to separated ground potentials, e.g. use different connecting pads for providing a low supply voltage.

According to an embodiment, the invention also provides a line driver cell for use in a line driver device of the above-mentioned type.

According to an embodiment, the line driver cell comprises a differential current output having a first output terminal and a second output terminal, a first control transistor connected to the first output terminal, a second control transistor connected to the second output terminal, a third control transistor connected to the first output terminal, and a fourth control transistor connected to the second output terminal. In addition, a first current generating device is provided for supplying a current through the first control transistor and the second control transistor, and second current generating device is provided for supplying a current through the third control transistor and the fourth control transistor. A differential output current signal of the line driver cell is controlled by a first control signal supplied to the control terminal of the first control transistor, a second control signal supplied to the control terminal of the second control transistor, and a third control signal supplied to a control terminal of the third control transistor, and a fourth control signal supplied to a control terminal of the fourth control transistor.

Using the above-mentioned control signals, the line driver cell may be controlled to provide the differential current output signal according to one of three different states. In one of the states, the differential output current signal is substantially zero.

In the first operating mode, corresponding to the class A mode, the differential output current being substantially zero is accomplished by controlling the control transistors in such a way that substantially the same current flows through the first output terminal and the second output terminal of the line driver cell. In the second operating mode, corresponding to the class B mode, the differential output current being substantially zero is accomplished by controlling the control transistors in such a way that the current flowing through both the first output terminal and the second output terminal is substantially zero. Accordingly, the line driver cell can be controlled by means of the control signals to provide a zero differential output current according to either the first operating mode, in which the line driver cell consumes a supply current, or according to a second operating mode, in which the line driver cell consumes substantially no supply current.

The first and second current generating devices may be implemented by means of a current mirror. In particular, the first current generating device and the second current generating device may be implemented by means of a cascode current mirror.

According to a further embodiment, the invention provides a method of operating a line driver device. The method comprises receiving an input signal of the line driver device, generating from the input signal a first control signal corresponding to a first operating mode of the line driver device, i.e. the class A mode, or generating from the input signal a second control signal corresponding to a second operating mode of the line driver device, i.e. the class B mode, and controlling an output stage of the line driver device by the first control signal or the second control signal. In order to provide a mixed operating mode of the line driver device, the output stage may be controlled by both the first control signal and the second control signal.

In the following, embodiments of the invention will be described with reference to the accompanying drawings.

FIG. 1 schematically illustrates a line interface of the FastEthernet type. A twisted pair signal line 30, e.g. a so-called UTP cable having twisted pair signal lines, is inductively coupled to a line driver 10 having a differential current output. The inductive coupling is achieved by means of a transformer 20 connected to a positive and negative differential current output IP, IN of the line driver 10. Connected in parallel to the transformer on the line driver side are resistors $R_1$ and $R_2$ having values of 50 Ohm, which in sum correspond to the impedance of the signal line 30.

Figure 2:
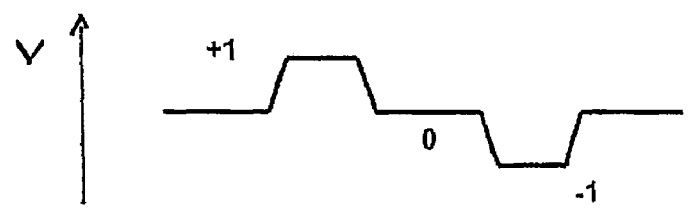
FIG. 2 is a schematic view of a data signal according to the MLT-3 standard.

In FIG. 2, an example of a signal waveform provided by the line driver 10 is shown. The signal waveform corresponds to the so-called MLT-3 standard, i.e. is formed by a sequence of three different signal states, in FIG. 2 designated as "+1", "0", and "−1". As the output signal of the line driver 10 has three different signal states, it may also be referred to as a "ternary" signal. According to the MLT-3 standard, the maximum output current is 40 mA, i.e. in the state "+1", the line driver provides a differential output current of +40 mA and in the state "−1" the line driver provides a differential output current of −40 mA. In the state "0" the differential output current is substantially zero.

As the line driver 10 illustrated in FIG. 1 has a differential current output, in principle there exist two possibilities for providing the signal state having zero output current. In a first possibility, a current having the same value may be imposed to both the positive and negative differential current outputs IP, IN of the line driver, thereby resulting in a zero differential current between the positive and negative differential current outputs IP, IN. This type of operation is referred to as class A mode. In a second possibility, no current may be supplied to both the positive and negative current outputs IP, IN of the line driver 10, which also results in the differential output current being substantially zero. This type of operation is referred to as class B mode.

Between the class A mode and the class B mode there exist the following differences: In the class A mode, the supply current of the line driver 10 always corresponds to the maximum output current, i.e. 40 mA, irrespective of the output signal provided by the line driver. In contrast to that, in the class B mode, if the output signal corresponds to the state "0", the supply current of the line driver 10 is substantially zero. Consequently, when assuming that the probability of the signal state "0" is 50%, the average current consumption in the class B mode is 20 mA, which is 50% of the average current consumption in the class A mode. Consequently, the class B mode has the advantage of a lower average current consumption.

However, in the class B mode, there may exist problems concerning the quality of the output signal. For example, there may be a rise time and a fall time asymmetry of the generally trapezoidal signal shape as illustrated in FIG. 2. Further, signal overshoots and undershoots may occur.

In view of the above, when designing a line driver, it is generally difficult to decide between using a class A mode line driver and a class B mode line driver. It will depend on the particular application of the line driver and the circuit environment of the line driver, which alternative is more appropriate.

Figure 3:
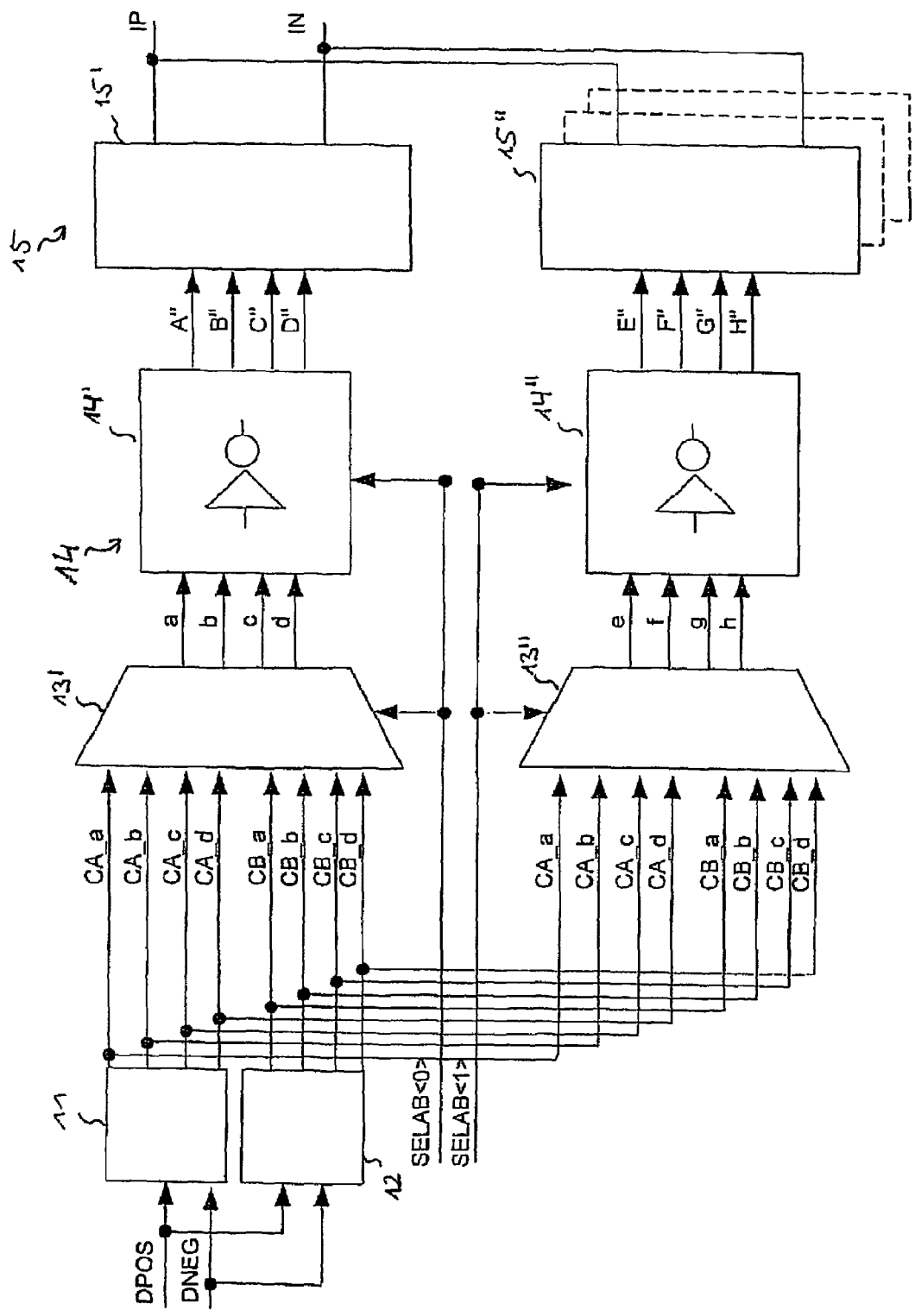
FIG. 3 is a block diagram of a line driver device according to an embodiment of the invention.

FIG. 3 illustrates a line driver device which combines the advantages of a class A mode line driver and of a class B mode line driver in a single line driver device. In particular, the line driver device can be controlled to operate in either a first operating mode, corresponding to a class A mode, a second operating mode, corresponding to a class B mode, or in one of two mixed modes having both class A mode and class B mode characteristics. The different operating modes of the line driver device are: class A mode, a first mixed mode having ¼ class A and ¾ class B characteristics, a second mixed mode having ¾ class A and ¼ class B characteristics, and the class B mode. The different operating modes are selected by means of select signals SELAB<0> and SELAB<1>.

The line driver device receives a differential input signal DPOS, DNEG, which is supplied to both a first encoder 11 and a second encoder 12. On the basis of the input signal DPOS, DNEG, the first encoder 11 generates a first encoded control signal having four signal components CA_a, CA_b, CA_c, CA_d. Similarly, the second encoder 12 generates from the input signal DPOS, DNEG a second encoded control signal having four signal components CB_a, CB_b, CB_c, CB_d.

The relation of the input signals of the first encoder 11 to its output signals is shown in the following table:

| Input signal | CA_a | CA_b | CA_c | CA_d |
|---|---|---|---|---|
| +1 | 0 | 1 | 0 | 1 |
| 0 | 1 | 0 | 0 | 1 |
| −1 | 1 | 0 | 1 | 0 |

The relation of the input signals of the second encoder 12 to its output signals is shown in the following table:

| Input signal | CB_a | CB_b | CB_c | CB_d |
|---|---|---|---|---|
| +1 | 0 | 1 | 0 | 1 |
| 0 | 0 | 0 | 0 | 0 |
| −1 | 1 | 0 | 1 | 0 |

The above type of encoding provides a basic functionality for controlling the line driver device to operate in either the class A mode, the class B mode or a mixed mode.

As illustrated, the line driver device comprises two branches, an upper branch and a lower branch. The upper branch and the lower branch both receive as their input signals the output signals of the first encoder 11 and the second encoder 12. In the upper branch, the output signals of the first encoder 11 and the second encoder 12 are supplied to a multiplexer 13'. In the lower branch, the output signals of the first encoder 11 and the second encoder 12 are supplied to a multiplexer 13". The multiplexers 13', 13" are 2:1-multiplexers, and are configured to selectively forward as their output signals a, b, c, d, and e, f, g, h, respectively, either the encoded signal CA_a, CA_b, CA_c, CA_d received from the first encoder 11 or the encoded signal CB_a, CB_b, CB_c, CB_d received from the second encoder 12. The multiplexer 13' in the upper branch is digitally controlled by the select signal SELAB<0>, and the multiplexer 13" is digitally controlled by the select signal SELAB<1>.

Next, the line driver device comprises a pre-driver stage 14. The pre-driver stage 14 has a first portion 14' in the upper branch and a second portion 14" the lower branch. The first portion 14' of the output stage 14 receives the output signals a, b, c, d from the multiplexer 13' of the upper branch. The second portion 14" of the pre-driver stage 14 receives the output signals e, f, g, h of the multiplexer 13" of the lower branch.

The pre-driver stage 14 is designed to pre-amplify or condition its input signals according to the selected operating mode of the line driver device. For this purpose, the pre-driver stage 14 is digitally controlled by the select signals SELAB<0> and SELAB<1>. The upper portion 14' of the pre-driver stage 14 is controlled by the select signal SELAB<0>, and the lower portion 14" of the pre-driver stage 14 is controlled by the select signal SELAB<1>.

The pre-driver stage 14 provides as its output signals conditioned signals A", B", C", D", E", F", G", and H", which correspond to conditioned versions of the input signals a, b, c, d, e, f, g, and h, respectively. The signals A", B", C", D", E", F", G", and H" are supplied to an output stage 15 of the line driver device.

The output stage 15 comprises a first portion 15' in the upper branch and a second portion 15" in the lower branch. By means of the signals A", B", C", D", E", F", G", and H" the output stage 15 can be controlled to provide a differential output current to differential current output terminals IP, IN of the line driver device. As the signals A", B", C", D", E", F", G", and H" correspond to the encoded signals CA_a, CA_b, CA_c, CA_d, CB_a, CB_b, CB_c, and CB_d generated by the first and second encoders 11, 12, in principle two different control operations are performed. On the one hand, the differential current output signal is controlled to assume one of three different states, i.e. the states "−1", "0", and "+1". On the other hand, the operating mode is selected, i.e. it is selected which configuration of the output stage 15 is used to provide the signal state "0".

The selection of the operating mode can be performed separately for the upper branch and the lower branch. As the output currents from the upper branch and the lower branch are combined at the differential current output of the line driver device, it is therefore possible to have mixed operating modes. For example, the upper branch may operate according to the class A mode while the lower branch operates according to the class B mode, and vice versa.

The upper branch and the lower branch of the line driver device are designed to provide different maximum output currents. In particular, the first portion 15' of the output stage 15 is designed to provide a maximum output current of 10 mA, whereas the second portion 15" of the output stage 15 is designed to provide a maximum output current of 30 mA. Accordingly, the combined maximum output current is 40 mA, as required by the MLT-3 standard. As the ratio between the maximum output currents of the upper branch and the lower branch is 1:3, the following mixed operating modes of the line driver device are obtained: If the upper branch is operated in the class A mode and the lower branch is operated in the class B mode, the mixed mode has ¼ class A mode and ¾ class B mode characteristics. If the upper branch is operated in the class B mode and the lower branch is operated in the class A mode, the mixed mode has ¾ class A mode characteristics and ¼ class B mode characteristics.

The first portion 15' and the second portion 15" of the output stage 15 are based on the same type of line driver unit. In particular, the first portion 15' comprises one line driver unit having a maximum output current of 10 mA, and the second portion 15" of the output stage comprises three line driver units of the same type, each having 10 mA maximum output current.

It is to be understood that the above concept could be generalized using different numbers of branches and different ratios of maximum output currents, thereby achieving different types and numbers of mixed modes.

Figure 4:
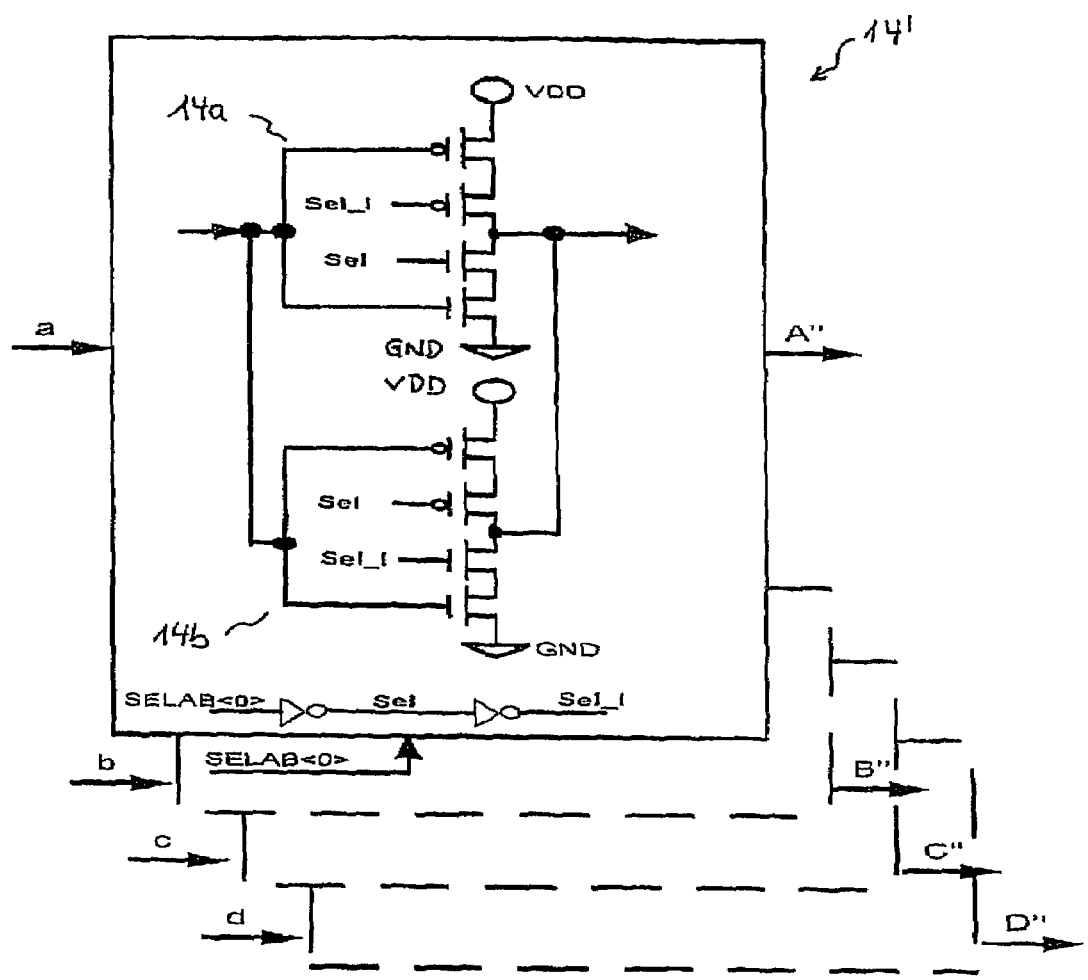
FIG. 4 illustrates a pre-driver stage of the line driver device shown in FIG. 3.

FIG. 4 schematically illustrates the structure of the first portion 14' of the pre-driver stage 14 in the line driver device of FIG. 3. For each of the input signals a, b, c, d, a pair of pre-drivers 14a, 14b is provided. In FIG. 4, only the pre-driver for the input signal a are shown. For the other input signals b, c, d, a pair of pre-drivers having the same structure is provided.

The pair of pre-drivers has a first pre-driver 14a and a second pre-driver 14b. The pre-drivers generally have an inverter-type structure. In particular, each pre-driver has a first p-type transistor, a second p-type transistor, a third n-type transistor, and a fourth n-type transistor connected in series between a high supply voltage VDD and a low supply voltage GND, i.e. a ground potential. A control terminal of the first transistor and of the fourth transistor is in each case supplied with the corresponding input signal a, b, c, d. In the first pre-driver 14a, the control terminal of the third transistor is connected to a select signal Sel. The control terminal of the second transistor is connected to an inverted select signal Sel_I. The inverted select signal Sel_I is inverted with respect to the select signal Sel. The select signal Sel is generated by inversion from the select signal SELAB<0>, and the inverted select signal Sel_I is generated by double inversion from the select signal SELAB<0>.

In the second pre-driver 14b, the allocation of the select signal Sel and the inverted select signal Sel_I to the control terminals of the second and third transistors is reversed with respect to the first pre-driver 14a, i.e. the select signal Sel is connected to the control terminal of the second transistor, and the inverted select signal Sel_I is connected to the control terminal of the third transistor.

A node between the source terminal of the second transistor and the drain terminal of the third transistor in each of the first and second pre-drivers 14a, 14b is connected to the corresponding signal output of the pre-driver stage 14.

The second portion 14" of the pre-driver stage 14 has a similar structure, however with the input signals a, b, c, and d being replaced by the signals e, f, g, and h, respectively, the output signals A", B", C", and D" being replaced by the signals E", F", G", and H", respectively, and the select signal SELAB<0> being replaced by the select signal SELAB<1>.

The operation of the pre-driver stage 14 is as follows: By means of the select signals SELAB<0>, SELAB<1>, the first pre-driver 14a and the second pre-driver 14b can be selectively activated or deactivated. In particular, the generation of the select signal Sel and the inverted select signal Sel_I from the select signals SELAB<0>, SELAB<1>ensures that only one of the first pre-driver 14a and the second pre-driver 14b is activated and provides the corresponding output signal of the pre-driver stage. When the select signals SELAB<0> or SELAB<1> have a low value, the first pre-driver 14a will be active and the second pre-driver 14b will be inactive. Conversely, when the select signals SELAB<0> or SELAB<1> have a high value, the second pre-driver 14b will be active and the first pre-driver 14a will be inactive. Accordingly, the first pre-driver 14a constitutes a pre-driver for the class A mode and the second pre-driver 14b constitutes a pre-driver for the class B mode.

The first pre-driver 14a and the second pre-driver 14b are different. By this means, it can be taken into account that in the class A mode and the class B mode the signal supplied to the output stage 15 has to be conditioned in a different manner so as to achieve an output signal of the line driver device which complies with the specifications. For example, the first line driver 14a and the second line driver 14b may be designed to have different slew rates or different sizes.

Figure 5:
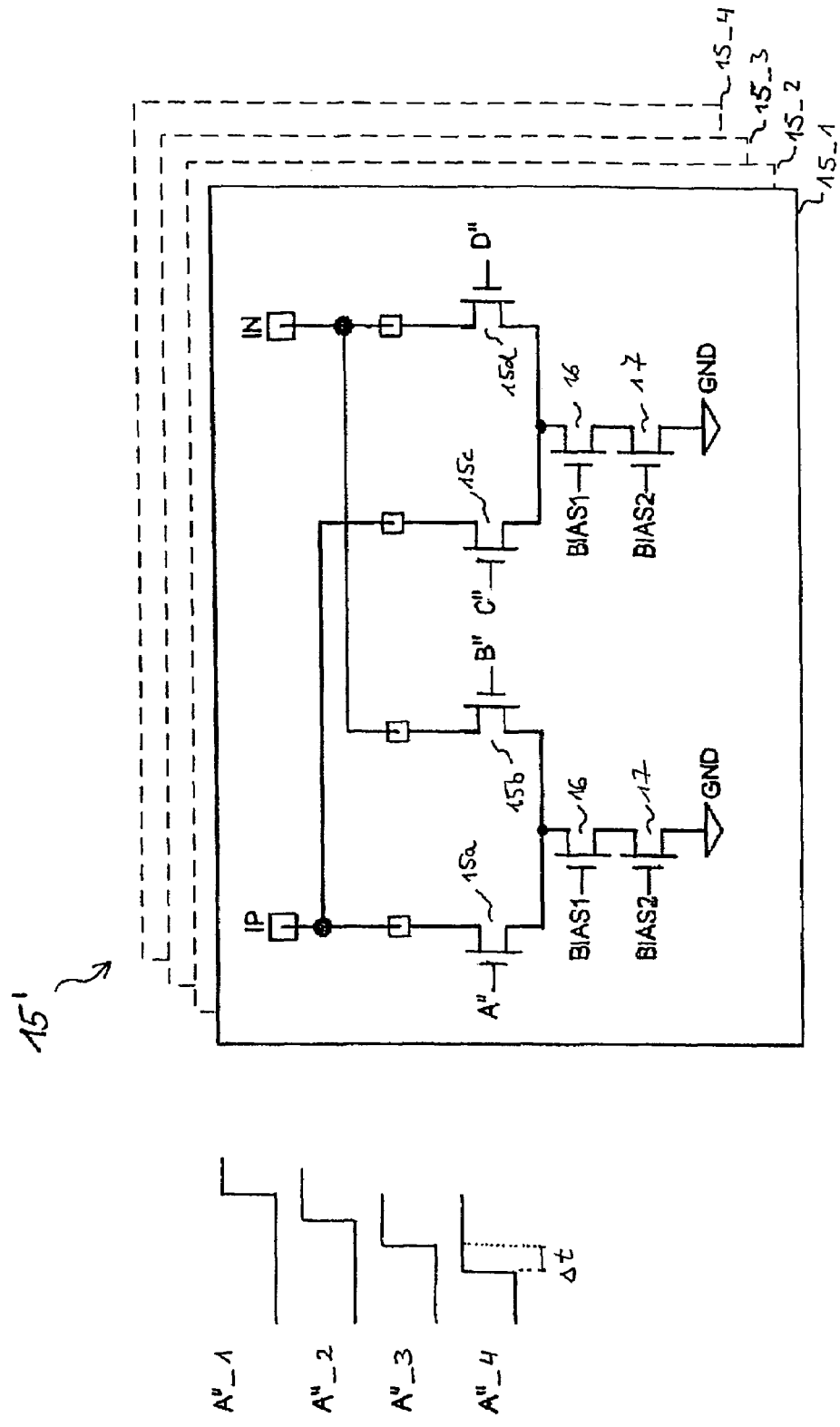
FIG. 5 illustrates line driver cells used in an output stage of the line driver device shown in FIG. 3.

FIG. 5 illustrates a line driver unit in the first portion 15' of the output stage 15. The line driver unit comprises a number of line driver cells, which are similar in their configuration and are designated by 15_1, 15_2, 15_3, and 15_4. In the following, only the structure of the line driver cell 15_1 will be explained.

The line driver cell 15_1 is configured to provide the differential output current signal according to one of two operating modes. A first operating mode corresponds to the class A mode and a second operating mode corresponds to the class B mode. The differential output current signal available at the differential current output terminals IP, IN can have one of the three states "−1", "0", "+1". Control of the signal states and the operating mode is performed by means of the signals A", B", C", and D".

The line driver cell comprises a first control transistor 15a connected with its drain terminal to the positive output terminal IP of the differential current output, and a second control transistor 15b connected with its drain terminal to the negative output terminal IN of the differential current output. For supplying a current through the first and the second control transistors 15a, 15b, first current generating means or a first current generating device are connected to the source terminals of the first and the second control transistors 15a, 15b. The first current generating means are formed by a first mirror transistor 16 and a second mirror transistor 17, connected in series between the source terminals of the first and second control transistors 15a, 15b and the ground potential.

The line driver cell 15_1 further comprises a third control transistor 15c connected with its drain terminal to the positive output terminal IP and a third control transistor 15d connected with its drain terminal to the negative output terminal IN. For supplying a current through the third control transistor 15c and the fourth control transistor 15d, second current generating means or a second current generating device are connected to the source terminals of the third and fourth control transistors 15c, 15d. The second current generating means are similar to the first current generating means and also comprise a first mirror transistor 16 and a second mirror transistor 17.

As can already be taken from the above, the first current generating means and the second current generating means are formed on the basis of a current mirror. This ensures that the current supplied to the first and second control transistors 15a, 15b and the current supplied to the third and fourth control transistors 15c, 15d has the same value. Further, similar current mirrors are used as current generating means in the other line driver cells, thereby providing a highly uniform unit current in each of the line driver cells.

As indicated in FIG. 5, a number of line driver cells together form a line driver unit. The line driver cells are sequentially controlled so as to provide ramp-type output signals in compliance with the MLT-3 standard. That is to say, the line driver cells of a line driver unit are sequentially activated or deactivated, so that their combined output approximates a ramp. For this purpose, the control signals A", B", C", and D" are generated in four different versions which are delayed with respect to each other by a predetermined delay Δt. By way of example for the signal A", this is illustrated on the left side of FIG. 5. As illustrated, there exist four different versions of the step-type signal A", which are designated by A"_1, A"_2, A"_3, and A"_4. These are applied to the respective control terminals of the first control transistors 15a in the current cells 15_1, 15_2, 15_3, and 15_4, respectively. The same concept is used for the signals B", C", and D".

In the second portion 15" of the output stage 15, the same type of line driver cell is used. However, in this case the signal supplied to the control terminals of the control transistors 15a, 15b, 15c, 15d are formed by the signals E", F", G", and H".

The operation of the line driver cell is as follows: In order to provide a positive differential output current from the output terminals IP, IN, the signals A" and C" have a low value, and the signals B" and D" have a high value. Therefore, a current corresponding to twice the unit current of the current generating means flows through the negative terminal IN, whereas no current flows through the positive terminal IP. The absolute value of the differential output current is twice the unit current.

In order to provide a negative differential output current, the signals A" and C" have a high value, and the signals B" and D" have a low value. Therefore, a current flows through the positive output terminal IP, whereas no current flows through the negative output terminal IN. Again, the absolute value of the differential output current is twice the unit current generated by the current generating means.

Two different possibilities exist to provide the third signal state, which corresponds to the differential output current being substantially zero. In the first case, the signals A" and D" have a high value and the signals B" and C" have a low value. In this case, the same current flows through the positive output terminal IP and through the negative output terminal IN. The resulting differential output current is substantially zero. This operating mode corresponds to the class A mode, as the line driver cell will consume supply current even when there is no differential output current from it. In a second possibility, each of the signals A", B", C", and D" has a low value, which results in no current flowing through both the positive output terminal IP and the negative output terminal IN. Also in this case, the resulting differential output current is substantially zero. However, when there is no differential output current from the line driver cell, also the supply current of the line driver cell will be substantially zero. The latter possibility corresponds to the class B mode.

In order to improve the signal quality in the class B mode, in particular in order to avoid signal overshoot, the first and second current generating means, i.e. the first and second mirror transistors 16, 17 form part of a cascode current mirror. This and the generation of bias voltages supplied to the control terminals of the mirror transistors 16, 17 is schematically illustrated in FIG. 6.

Figure 6:
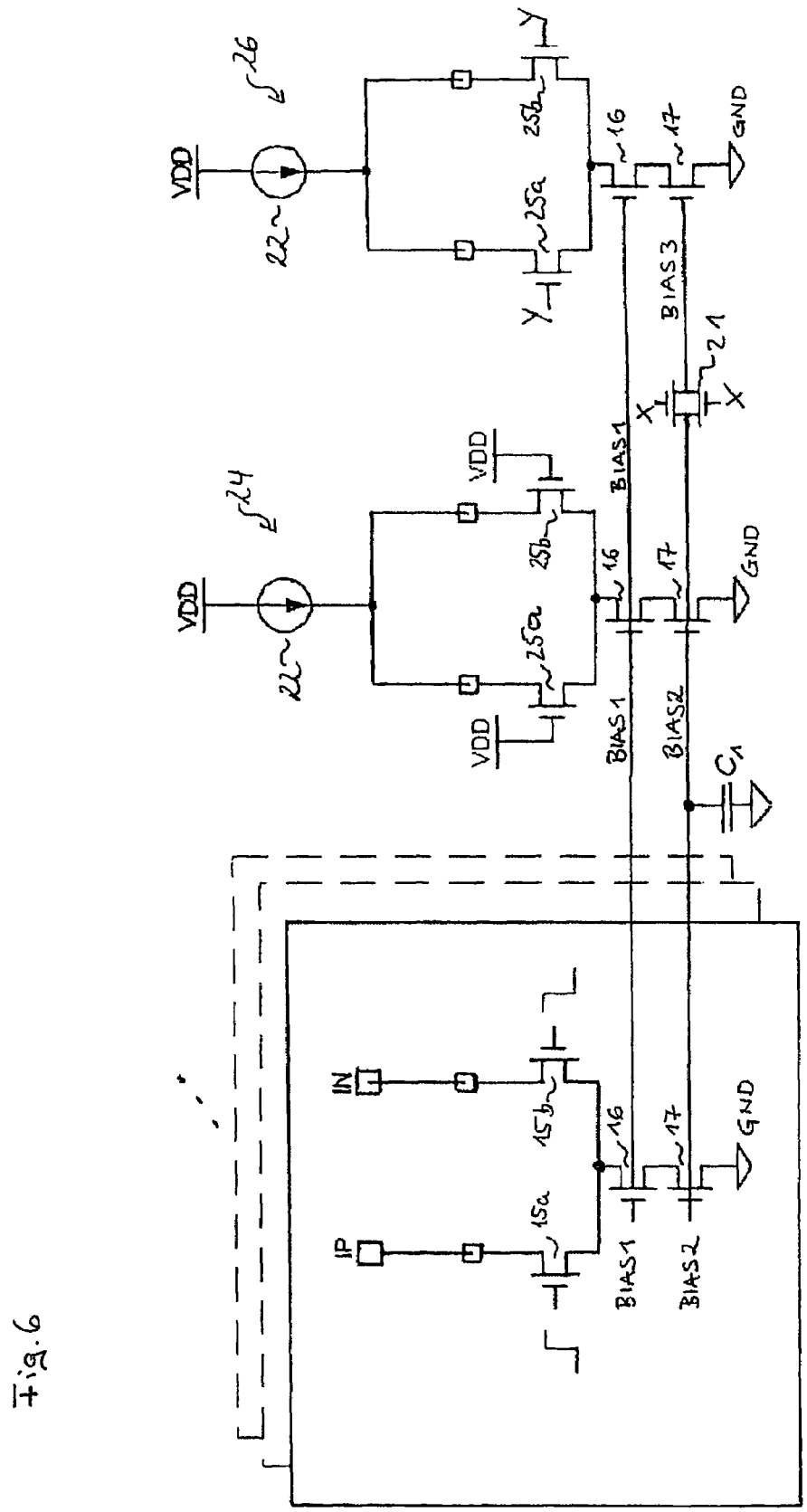
FIG. 6 illustrates a cascode current mirror used in the output stage of the line driver device shown in FIG. 3.

On the left side of FIG. 6, there is illustrated a pair of control transistors 15a, 15b of a line driver cell, which are connected with their source terminals to the current generating means having the first and second mirror transistors 16, 17. The control terminal of the first mirror transistor 16 is connected to a first bias potential BIAS1, and the control terminal of the second mirror transistor is connected to a second bias potential BIAS2.

In the class B mode, current flow is completely suppressed when the output signal of the line driver cell is zero. Therefore, the second bias potential BIAS2 may fluctuate according to the activation or deactivation of line driver cells. In order to address this problem, a cascode current mirror arrangement as illustrated in FIG. 6 is used. That is to say, the current generating means have the first and second mirror transistor 16, 17 connected in series, and the first bias potential BIAS1 and the second bias potential BIAS2 are derived from a replica current cell 24. The replica current cell 24 generally has the same structure as the line driver cell, with a pair of control transistors 25a, 25b that are connected with their source terminals to a pair of mirror transistors 16, 17. The mirror transistors 16, 17 of the replica current cell 24 are connected between the source terminals of the control transistors 25a, 25b and the ground potential GND. The drain terminals of the control transistors are connected via a current source to the positive supply voltage VDD. The control terminals of the control transistors 25a, 25b are connected to a high potential, i.e. the positive supply voltage VDD, such that a current always flows through the replica current cell. As illustrated, the mirror transistors 16, 17 in the line driver cells and the mirror transistors 16, 17 in the replica current cell form a cascode current mirror.

While the mere use of a cascode current mirror already provides for an improved output signal quality, overshoot can be further reduced by adding a capacitor $C_1$ between the second bias potential and ground. In this way, fluctuations of the second bias potential BIAS2 are smoothed.

In addition, the cascode current mirror further includes a dummy cell 26. The dummy cell 26 has a similar structure as the replica current cell 24. However, the second mirror transistor 17 is not directly connected with its control terminal to the second bias potential BIAS2, but is connected to the second bias potential BIAS2 via a switch 21. The switch 21 is controlled by means of a control signal X. The control transistors 25a, 25b of the dummy cell 26 are controlled by means of a control signal Y. The control signal Y can be used to activate or deactivate the dummy cell 26, thereby allowing to reduce the power consumption of the line driver device by deactivating the dummy cell 26 when it is not used.

The effect of this arrangement is the following: In normal operation, i.e. when there are no large output current fluctuations, the current flowing in the line-driver cells, in the replica current cell 24 and in the dummy cell 26 will have approximately equal values, and a third bias potential BIAS3 generated at control terminal of the second mirror transistor 17 of the dummy cell 26 will be approximately equal to the second bias potential BIAS2. When the output current of the line driver cells changes, the second bias potential BIAS2 may increase or decrease. The third bias potential BIAS3 will however remain unaffected. Accordingly, by opening the switch 21, a charge equalization between the second bias potential BIAS2 and the third bias potential BIAS3 can be achieved. This is used to further reduce fluctuations of the second bias potential BIAS2.

The procedure of using the switch 21 for reducing the fluctuations of the second bias potential BIAS2 is further illustrated in FIG. 7. In the upper section I. of FIG. 7, a clock pulse signal X for controlling the switch 21 is shown. Generally, the clock pulse is generated at times when a large variation of the output current from the line driver cells is expected. Possible variations of the second bias potential BIAS2 are illustrated in section II. of FIG. 7. By opening the switch 21, a charge equalization occurs between the third bias potential BIAS3 and the second bias potential BIAS2, and fluctuations of the second bias potential BIAS2 are reduced.

Section III. of FIG. 7 illustrates the trapezoidal waveform of the MLT-3 type signal, in which sequentially activated line driver cells are used to generate a ramp-type signal shape. In section IV., phase-shifted clock signals for controlling the sequential activation are illustrated. The clock signals used for controlling the above-mentioned operations may have a clock period T of 8 ns. Accordingly, when using a 90° phase shift between the clocks for controlling the different line driver cells of a line driver unit, a step length in the signal ramp of 1 ns may be obtained. As a matter of course, different clock periods and different phase shifts may be used so as to obtain different step sizes.

The output current signal of the line driver device may be low-pass filtered, so that the step-like signal shape is smoothed so as to obtain a trapezoidal signal shape.

Further, the line driver device of FIG. 3 may use separated ground potentials for the pre-driver stage and the output stage. By this means, an asymmetry between rising and falling edges of the trapezoidal waveform is reduced. In particular, the ground potential may be obtained from different connection pads of a chip.

To summarize, in the foregoing a line driver device, a corresponding line driver cell structure and method of operating the line driver device has been explained, which allows for significant improvements with respect to power consumption and signal quality. In particular, the line driver device allows for adapting the line driver device to the specific requirements of the desired application without having to change the hardware structure. In particular, different operating modes can be selected using a digital control signal. Further, the line driver device offers the possibility to further improve the signal quality by reducing bias potential fluctuations. In particular, using the switch to achieve a charge equalization can be easily implemented and is moderate in its requirements with respect to chip area.

The invention claimed is:

1. A line driver device including an output stage, the output stage operable to provide an output current according to at least a first or a second operating mode of the line driver device, wherein the first operating mode corresponds to a class A mode and the second operating mode corresponds to a class B mode,
wherein the line driver device includes a first branch with a first portion of the output stage, and a second branch with a second portion of the output stage.

2. The line driver device according to claim 1,
wherein the output stage is further operable to provide the output current according to a mixed mode having characteristics of both the first operating mode and the second operating mode.

3. The line driver device according to claim 1,
wherein the output stage is further operable to provide the output current according to a plurality of operating modes corresponding to different mixed modes, the different mixed modes each having a predetermined ratio of characteristics of the first operating mode with respect to characteristics of the second operating mode.

4. The line driver device according to claim 1,
wherein the first portion of the output stage and the second portion of the output stage have different maximum output currents.

5. The line driver device according to claim 1,
wherein a ratio of the maximum output current of the first portion of the output stage to the maximum output current of the second portion of the output stage is 1:3.

6. The line driver device according to claim 1,
wherein the first portion of the output stage and the second portion of the output stage each comprise a number of line driver ceils configured to controllably provide a select one of a positive unit output current, a negative unit output current or a zero output current, and
wherein the line driver cells are controlled by an encoded input signal so as to provide the zero output current according to either the first operating mode or the second operating mode.

7. The line driver device according to claim 6,
wherein the line driver cells are grouped into line driver units, and
wherein the line driver device is configured to sequentially activate or deactivate the line driver cells of a line driver unit so as to provide a ramp-type output signal of the line driver unit.

8. The line driver device according to claim 6, wherein the line driver units to have a maximum output current of 10 mA.

9. The line driver device according to claim 6, wherein the line driver device comprises a cascode current mirror for providing a supply current of the line driver cells.

10. The line driver device according to claim 1, comprising a pre-driver stage having at least one pre-driver of a first type and at least one pre-driver of a second type, wherein the pre-drivers of the first and second type are operable to be selectively activated or deactivated according to a selected operating mode of the line driver device.

11. The line driver device according to claim 10,
wherein the pre-drivers of the first and second types have different structures.

12. The line driver device according to claim 1, comprising a first encoder configured to receive an input signal of the line driver device and to generate a first control signal for controlling a line driver cell of the output stage to operate according to the first operating mode, and
a second encoder configured to receive an input signal of the line driver device and to generate a second control signal for controlling a line driver cell of the output stage to operate according to the second operating mode.

13. The line driver device according to claim 12, comprising
a multiplexer configured to receive the first and second control signals from the first and second encoder and to selectively forward either the first control signal from the first encoder or the second control signal from the second encoder.

14. A line driver device including:
an output stage, the output stage operable to provide an output current according to at least a first or a second operating mode of the line driver device,
a first encoder configured to receive an input signal of the line driver device and to generate a first control signal for controlling a line driver cell of the output stage to operate according to the first operating mode, and
a second encoder configured to receive an input signal of the line driver device and to generate a second control signal for controlling a line driver cell of the output stage to operate according to the second operating mode, wherein
the first operating mode corresponds to a class A mode and the second operating mode corresponds to a class B mode, and wherein
the line driver device comprises a first branch with a first portion of the output stage, and a second branch with a second portion of the output stage, wherein the first branch comprises a first multiplexer to receive the first and second control signals from the first and second encoders and selectively forward either the first control signal from the first encoder or the second control signal from the second encoder to the first portion of the output stage, and wherein the second branch comprises a second multiplexer to receive the first and second control signals from the first and second encoders and selectively forward either the first control signal from the first encoder or the second control signal from the second encoder to the second portion of the output stage.

15. The line driver device according to claim 1, comprising a pre-driver stage to provide conditioned input signals to the output stage,
wherein the pro-driver stage and the output stage are connected to separated ground potentials.

16. The line driver device according to claim 1,
wherein the class A mode corresponds to an operating mode in which the line driver device has a supply current which is substantially independent of the output signal of the line driver device, and
wherein the class B mode corresponds to an operating mode in which the line driver device has a supply current which is substantially zero at least for some values of the output signal from the line driver device.

17. A line driver cell, comprising
a differential current output having a first output terminal and a second output terminal,
a first control transistor connected to the first output terminal,
a second control transistor connected to the second output terminal,
a third control transistor connected to the first output terminal,
a fourth control transistor connected to the second output terminal,
a first current generating device to provide a current through the first control transistor and the second control transistor,
a second current generating device to provide a current through the third control transistor and the fourth control transistor,
wherein a differential output current signal of the line driver cell is controlled by
a first control signal supplied to a control terminal of the first control transistor,
a second control signal supplied to a control terminal of the second control transistor,
a third control signal supplied to a control terminal of the third control transistor, and
a fourth control signal supplied to a control terminal of the fourth control transistor;
wherein the first current generating device and the second current generating device are configured to provide substantially the same current wherein the first current generating device and the second current generating device form part of a current mirror, wherein the first current generating device and the second current generating device form part of a cascade current mirror; and
wherein the cascode current mirror comprises:
a first mirror transistor and a second minor transistor connected in series between the first mirror transistor and a circuit point having a fixed potential, the first mirror transistor and the second mirror transistor forming the first or the second current generating device of the line driver cell;

a replica current cell having a third mirror transistor and a fourth mirror transistor connected in series between the third mirror transistor and a circuit point having the fixed potential, the third and the fourth mirror transistors being connected to a current source,
wherein control inputs of the first and third mirror transistors are interconnected and have a first bias potential, and
wherein control inputs of the second and fourth mirror transistors are interconnected and have a second bias potential 18. The line drive cell according to claim 17, wherein the second bias potential is connected to a circuit point having the fixed potential via a capacitor.

19. The line driver cell according to claim 17, wherein the fixed potential corresponds to a ground potential.

20. The line driver cell according to claim 17,
wherein the cascode current mirror comprises a dummy cell having a further current source, a fifth mirror transistor connected in series to the further current source and a sixth mirror transistor connected in series between the fifth mirror transistor and a circuit point having the fixed potential,
wherein a control input of the fifth mirror transistor is connected to the first bias potential, and
wherein a control input of the sixth mirror transistor has a third bias potential and is connected to the second bias potential via a switch 21. The line driver cell according to claim 20, comprising a controller configured to open the switch so as to allow for a charge equalization between the second bias potential and the third bias potential.

22. A method of operating a line driver device, comprising:
a) receiving an input signal of the line driver device,
b) generating from the input signal a control signal corresponding to at least a select one of a first operating mode of the line driver device or a second control signal corresponding to a second operating mode of the line drive device, and
c) controlling an output stage of the line driver device by the control signal so as to provide an output current according to at least a first or a second operating mode of the line driver device,
wherein the first operating mode corresponds to a class A mode and the second operating mode corresponds to a class B mode,
wherein the line driver device comprises a cascode current mirror for providing a supply current to line driver cells of the output stage,
wherein the cascode current mirror comprises in each line driver cell at least a first mirror transistor and a second mirror transistor connected in series to a circuit point having a fixed potential and
wherein the cascode current mirror comprises a replica current cell having a third mirror transistor and a fourth mirror transistor connected in series to a circuit point having the fixed potential,
wherein control terminals of the first mirror transistor and the third mirror transistor are connected to each other and have a first bias potential,
wherein control terminals of the second and fourth mirror transistors are connected to each other and have a second bias potential,
wherein the cascode current mirror further comprises a dummy cell having a fifth mirror transistor and a sixth mirror transistor connected in series to a circuit point having the fixed potential, wherein a control terminal of the fifth mirror transistor is connected to the first bias potential, wherein a control terminal of the sixth mirror transistor is connected to the second bias potential via a switch and has a third bias potential, and wherein the method comprises controlling opening of the switch so as to obtain a charge equalization between the second bias potential and the third bias potential.

23. A method of operating a line driver device, comprising:
a) receiving an input signal of the line driver device,
b) generating from the input signal a control signal corresponding to at least a select one of a first operating mode of the line driver device or a second control signal corresponding to a second operating mode of the line drive device, and
c) controlling an output stage of the line driver device by the control signal so as to provide an output current according to at least a first or a second operating mode of the line driver device, wherein the first operating mode corresponds to a class A mode and the second operating mode corresponds to a class B mode wherein step c) further comprises controlling the output stage of the line drive device such that a plurality of different mixed operating modes of the line driver device are provided, the different mixed operating modes each having a predetermined ratio of characteristics of the first operating mode with respect to characteristics of the second operating mode, and wherein a pre-diver stage comprises at least one pre-driver of a first type and at least one pre-driver of a second type, and further comprising selectively activating or deactivating either the first type of pre-driver or the second type of pre-driver according to the select one of the first operating mode or the second operating of the line driver device.

24. The method according to claim 22, wherein the control signal further comprises a first control signal corresponding to a first operating mode, and a second control signal corresponding to a second operating mode, and further comprising controlling the output stage of the line driver device by both the first control signal and the second control signal so as to provide a mixed operating mode of the line driver device.

* * * * *

UNITED STATES PATENT AND TRADEMARK OFFICE
CERTIFICATE OF CORRECTION

PATENT NO.        : 7,508,236 B2
APPLICATION NO.   : 11/507359
DATED             : March 24, 2009
INVENTOR(S)       : Lai et al.

Page 1 of 1

It is certified that error appears in the above-identified patent and that said Letters Patent is hereby corrected as shown below:

On the Title Pg, under Item (75) Inventors:
replace "Fermion LAI" with --Fu Shiang LAI--

Claim 23 (column 15, line 22): insert --,-- after the word "mode"
Claim 17 (column 13, line 59): replace "cascade" with --cascode--
Claim 20 (column 14, line 28): insert --full stop-- after the word "switch"

Signed and Sealed this

Eighth Day of September, 2009

David J. Kappos
*Director of the United States Patent and Trademark Office*